US012757505B2

(12) United States Patent
Oh et al.

(10) Patent No.: US 12,757,505 B2
(45) Date of Patent: Oct. 6, 2026

(54) IMAGE SENSING PIXEL CONFIGURATIONS FOR REDUCED DARK CURRENT NOISE

(71) Applicant: Microsoft Technology Licensing, LLC, Redmond, WA (US)

(72) Inventors: Minseok Oh, Santa Clara, CA (US); Rui Jin, Mountain View, CA (US)

(73) Assignee: Microsoft Technology Licesning, LLC, Redmond, WA (US)

( * ) Notice: Subject to any disclaimer, the term of this patent is extended or adjusted under 35 U.S.C. 154(b) by 403 days.

(21) Appl. No.: 18/484,267

(22) Filed: Oct. 10, 2023

(65) Prior Publication Data

US 2025/0120198 A1 Apr. 10, 2025

(51) Int. Cl.
*H10F 39/00* (2025.01)
*H10F 39/18* (2025.01)

(52) U.S. Cl.
CPC ......... *H10F 39/8027* (2025.01); *H10F 39/18* (2025.01); *H10F 39/8023* (2025.01); *H10F 39/8063* (2025.01); *H10F 39/807* (2025.01)

(58) Field of Classification Search
None
See application file for complete search history.

(56) References Cited

U.S. PATENT DOCUMENTS

2020/0020730 A1 1/2020 Mlinar
2020/0021754 A1 1/2020 Borthakur
2020/0388643 A1* 12/2020 Ma ...................... H10F 39/8023
2023/0276144 A1 8/2023 Price

OTHER PUBLICATIONS

International Search Report and Written Opinion received for PCT Application No. PCT/US2024/047342, (MS# 413624-PCT01) Dec. 3, 2024, 14 pages.
Morimoto, et al., "Megapixel Time-Gated SPAD image sensor for 2D and 3D Imaging Applications," Optica Research Article, vol. 7, No. 4, pp. 346-354.
International Preliminary Report on Patentability (Chapter I) received for PCT Application No. PCT/US2024/047342 mailed on Date Apr. 23, 2026, 08 Pages.

* cited by examiner

*Primary Examiner* — Anthony Ho
(74) *Attorney, Agent, or Firm* — Workman Nydegger

(57) ABSTRACT

An image sensor comprises a plurality of image sensing pixels arranged to form a sensor array. Each image sensing pixel of the plurality of image sensing pixels comprises a semiconductor photodetector connected to a photosensitive region that comprises a photon reception area configured to receive photons to facilitate image capture. For at least a particular image sensing pixel of the plurality of image sensing pixels, the length or the width of the photon reception area is smaller than about 80% of a pixel pitch measurement between the particular image sensing pixel and an adjacent image sensing pixel, which contributes to reduced volume of the photosensitive region and mitigated sensor noise. A space between the photosensitive region of the particular image sensing pixel and the photosensitive region of the adjacent image sensing pixel comprises at least one oxide layer and/or at least one metal layer.

18 Claims, 8 Drawing Sheets

200

IMAGE SENSING PIXEL CONFIGURATIONS FOR REDUCED DARK CURRENT NOISE

BACKGROUND

Mixed-reality (MR) systems, including virtual-reality and augmented-reality systems, have received significant attention because of their ability to create truly unique experiences for their users. For reference, conventional virtual-reality (VR) systems create a completely immersive experience by restricting their users' views to only a virtual environment. This is often achieved, in VR systems, through the use of a head-mounted device (HMD) that completely blocks any view of the real world. As a result, a user is entirely immersed within the virtual environment. In contrast, conventional augmented-reality (AR) systems create an augmented-reality experience by visually presenting virtual objects that are placed in or that interact with the real world.

As used herein, VR and AR systems are described and referenced interchangeably. Unless stated otherwise, the descriptions herein apply equally to all types of mixed-reality systems, which (as detailed above) includes AR systems, VR reality systems, and/or any other similar system capable of displaying virtual objects.

Some MR systems include one or more cameras for facilitating image capture, video capture, and/or other functions. For instance, cameras of an MR system may utilize images and/or depth information obtained using the camera (s) to provide pass-through views of a user's environment to the user. An MR system may provide pass-through views in various ways. For example, an MR system may present raw images captured by the camera(s) of the MR system to a user. In other instances, an MR system may modify and/or reproject captured image data to correspond to the perspective of a user's eye to generate pass-through views. An MR system may modify and/or reproject captured image data to generate a pass-through view using depth information for the captured environment obtained by the MR system (e.g., using a depth system of the MR system, such as a time-of-flight camera, a rangefinder, stereoscopic depth cameras, etc.). In some instances, an MR system utilizes one or more predefined depth values to generate pass-through views (e.g., by performing planar reprojection).

In some instances, pass-through views generated by modifying and/or reprojecting captured image data may at least partially correct for differences in perspective brought about by the physical separation between a user's eyes and the camera(s) of the MR system (known as the "parallax problem," "parallax error," or, simply "parallax"). Such pass-through views/images may be referred to as "parallax-corrected pass-through" views/images. By way of illustration, parallax-corrected pass-through images may appear to a user as though they were captured by cameras that are co-located with the user's eyes.

A pass-through view can aid users in avoiding disorientation and/or safety hazards when transitioning into and/or navigating within a mixed-reality environment. Pass-through views may also enhance user views in low visibility environments. For example, mixed-reality systems configured with long wavelength thermal imaging cameras may facilitate visibility in smoke, haze, fog, and/or dust. Likewise, mixed-reality systems configured with low light imaging cameras facilitate visibility in dark environments where the ambient light level is below the level required for human vision.

MR systems utilize various types of image sensors with various types of semiconductor photodetectors for capturing pass-through imagery and/or other purposes. Some image sensors used in MR systems utilize complementary metal-oxide-semiconductor (CMOS) photodetectors. For example, CMOS image sensors may include image sensing pixel arrays where each pixel is configured to generate electron-hole pairs in response to detected photons. The electrons may become stored in per-pixel capacitors, and the charge stored in the capacitors may be read out to provide image data (e.g., by converting the stored charge to a voltage).

Some image sensors used in MR systems utilize single photon avalanche diode (SPAD) photodetectors. A SPAD pixel is operated at a bias voltage that enables the SPAD to detect a single photon. Upon detecting a single photon, an electron-hole pair is formed, and the electron is accelerated across a high electric field, causing avalanche multiplication (e.g., generating additional electron-hole pairs). Thus, each detected photon may trigger an avalanche event. A SPAD may operate in a gated manner (each gate corresponding to a separate shutter operation), where each gated shutter operation may be configured detect an avalanche and to result in a binary output. The binary output may comprise a "1" where an avalanche event was detected during an exposure (e.g., where a photon was detected), or a "0" where no avalanche event was detected.

Separate shutter operations may be performed consecutively and integrated over a frame capture time period. The binary output of the consecutive shutter operations over a frame capture time period may be counted, and an intensity value may be calculated based on the counted binary output. An array of SPADs may form an image sensor, with each SPAD forming a separate pixel in the SPAD array. To capture an image of an environment, each SPAD pixel may detect avalanche events and provide binary output for consecutive shutter operations in the manner described herein. The per-pixel binary output of consecutive shutter operations over a frame capture time period may be counted, and per-pixel intensity values may be calculated based on the counted per-pixel binary output. The per-pixel intensity values may be used to form an intensity image of an environment.

A key source of noise in CMOS and SPAD imagery when imaging under low light conditions is dark current noise. There is an ongoing need and desire for improvements to the image quality of CMOS and SPAD imagery, particularly for imagery captured under low light conditions where dark current noise can be prevalent. The presence of dark current noise in captured imagery can affect various operations associated with MR experiences, such as pass-through imaging, late stage reprojection, rolling shutter corrections, object tracking (e.g., hand tracking), surface reconstruction, semantic labeling, 3D reconstruction of objects, and/or others.

The subject matter claimed herein is not limited to embodiments that solve any challenges or that operate only in environments such as those described above. Rather, this background is only provided to illustrate one exemplary technology area where some embodiments described herein may be practiced.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

Figure 1:
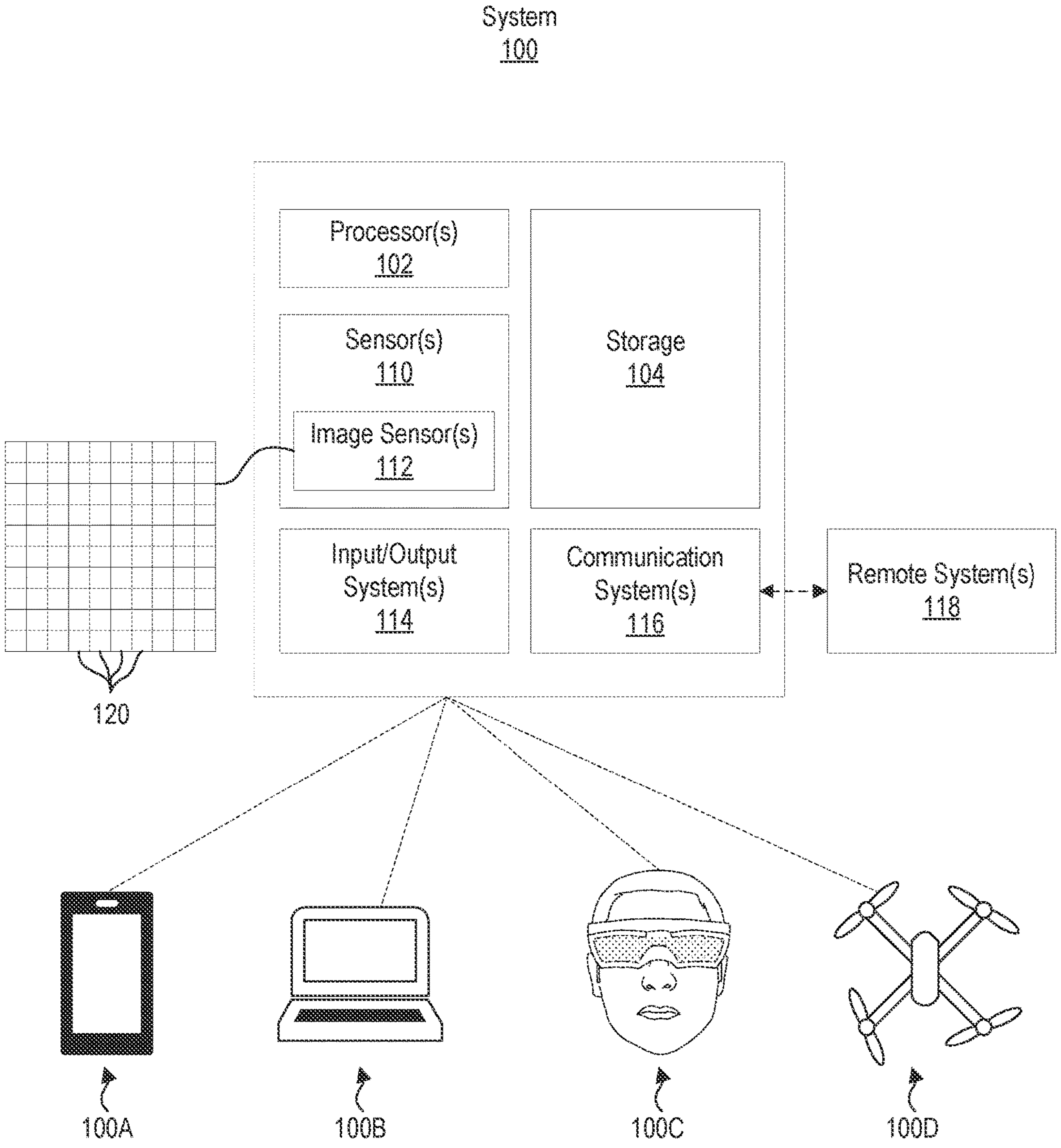
FIG. 1 illustrates example components of an example system that may include or be used to implement one or more disclosed embodiments.

Disclosed embodiments are generally directed to image sensing pixel configurations for reduced dark current noise, and systems, methods, and devices associated therewith.

Examples of Technical Benefits, Improvements, and Practical Applications

Those skilled in the art will recognize, in view of the present disclosure, that at least some of the disclosed embodiments may be implemented to address various shortcomings associated with at least some conventional imaging systems, particularly for imaging under low light conditions. The following section outlines some example improvements and/or practical applications provided by the disclosed embodiments. It will be appreciated, however, that the following are examples only and that the embodiments described herein are in no way limited to the example improvements discussed herein.

As noted above, there is an ongoing need and desire for improvements to the image quality of CMOS and SPAD imagery, particularly for imagery captured under low light conditions where dark current noise can be prevalent. Dark current (sometimes referred to as reverse bias leakage current) refers to a small electric current that flows through photosensitive devices (e.g., CMOS or SPAD image sensors) even when no photons are entering the device. Dark current can be thermally induced or brought about by crystallographic and/or manufacturing irregularities and/or defects that may arise from silicon processing and that may remain even after annealing.

In CMOS image sensors, dark current can cause electron-hole pairs to be generated in the detection region, even when no corresponding photons are detected. The electron-hole pairs brought about by dark current can contribute to the stored charge that is read out to form image data. Dark current can thus artificially increase the amount charge stored for an image pixel, resulting in inaccuracy and/or high-frequency noise in captured imagery.

In SPAD image sensors, dark current can cause one or more electron-hole pairs to be generated in the depletion region and can trigger avalanche events, even when no photons are detected/present. Avalanche events brought about by dark current are typically counted as detected photons, which can cause the binary output of a SPAD to include false counts (or "dark counts"). In SPAD imagery, dark counts can cause the intensity values assigned to at least some SPAD pixels to be inaccurately high, and can add dark current noise (e.g., random spatio-temporal noise) to SPAD imagery.

In some instances, the effects of dark current noise are prominent when imaging under low light conditions, contributing to high fixed pattern and temporal noise that degrades user experiences. These pixels or groups of pixels, also known as hot clusters, are regions with higher dark current (also referred to as "dark counts") than adjacent pixels.

Various techniques exist for compensating for dark current noise in CMOS and SPAD imagery. Such techniques include obtaining a dark current image that indicates the location of image sensing pixels of an image sensing pixel array that generate dark current, as well as the magnitude of dark current generated. A dark current image may be obtained during a calibration operation or based on imagery captured at runtime. The dark current image can be used at runtime to modify images captured using the sensor array to compensate for dark current, such as by performing a subtraction operation that subtracts the dark current image from the captured runtime imagery.

However, even when conventional dark current compensation operations are implemented, at least some dark current noise may persist in captured imagery. Thus, at least some embodiments of the present disclosure provide improved image sensor pixel configurations for enabling capture of noise-mitigated imagery (e.g., with reduced dark current noise).

Many conventional image sensors adapted for capturing images under low light conditions (e.g., where ambient light is below about 10 lux) use relatively large pixels (i.e., pixels with a pixel pitch in the 6 to 16 μm range) and seek to maximize the volume of the silicon region in an attempt to enable the sensor pixels to capture all possible photons to generate output imagery. A silicon region of an image sensing pixel comprises the photon input region in which detected photons may cause electron-hole pairs to be formed. The electron-hole pairs (or events/effects resulting therefrom, such as avalanche multiplication events) may be measured or quantified by the semiconductor photodetector (e.g., CMOS or SPAD) of the image sensing pixel to indicate light level for the portion of the environment captured by the pixel. The silicon region of an image sensing pixel may reside beneath the micro-lens for the pixel. The micro-lens may direct environment light toward a photon reception area of the silicon region (e.g., the environment-facing portion/area of the silicon region) through which photons may pass to reach the volume of the silicon region to cause formation of electron-hole pairs.

Counter-intuitively, and unexpectedly, it has been found that although reducing the silicon region volume of image sensing pixels reduces the photon detection capacity (e.g., full-well capacity) of the image sensing pixel, the reduction in silicon region volume also reduces the amount of dark current noise present in captured imagery (e.g., by reducing the volume in which silicon defects may be present), amounting to a net improvement in captured image quality (e.g., particularly when imaging under low light conditions).

Accordingly, in contrast with conventional approaches for improving low-light imagery, embodiments of the present disclosure are directed to image sensors that include pixels with a reduced silicon region volume. Image sensors implementing the disclosed principles may capture noise-mitigated imagery, especially when imaging under low light conditions.

Although the present disclosure focuses, in at least some respects, on examples that include CMOS and SPAD sensors (e.g., CMOS and SPAD sensor(s) implemented on an HMD), the principles disclosed herein may be applied to other types of image sensors.

Although various examples discussed herein focus, in at least some respects, on image sensor pixel configurations for implementation on MR systems or other types of HMDs, the image sensor pixel configurations discussed herein may be utilized in conjunction with other types of devices, such as security systems, automotive systems, machine vision systems, and/or other types of devices.

Having just described some of the various high-level features and benefits of the disclosed embodiments, attention will now be directed to the Figures, which illustrate various conceptual representations, architectures, methods, and supporting illustrations related to the disclosed embodiments.

Example Systems, Components, and Image Sensor Pixel Configurations for Reduced Dark Current Noise FIG. 1 illustrates various example components of a system 100 that may be used to implement one or more disclosed embodiments. For example, FIG. 1 illustrates that a system 100 may include processor(s) 102, storage 104, sensor(s) 110, image sensor(s) 112, input/output system(s) 114 (I/O system(s) 114), and communication system(s) 116. Although FIG. 1 illustrates a system 100 as including particular components, one will appreciate, in view of the present disclosure, that a system 100 may comprise any number of additional or alternative components.

The processor(s) 102 may comprise one or more sets of electronic circuitry that include any number of logic units, registers, and/or control units to facilitate the execution of computer-readable instructions (e.g., instructions that form a computer program). Such computer-readable instructions may be stored within storage 104. The storage 104 may comprise computer-readable recording media and may be volatile, non-volatile, or some combination thereof. Furthermore, storage 104 may comprise local storage, remote storage (e.g., accessible via communication system(s) 116 or otherwise), or some combination thereof. Additional details related to processors (e.g., processor(s) 102) and computer storage media (e.g., storage 104) will be provided hereinafter.

In some instances, the system may rely at least in part on communication system(s) 116 for receiving data from remote system(s) 118, which may include, for example, separate systems or computing devices, sensors, and/or others. The communications system(s) 116 may comprise any combination of software or hardware components that are operable to facilitate communication between on-system components/devices and/or with off-system components/devices. For example, the communications system(s) 116 may comprise ports, buses, or other physical connection apparatuses for communicating with other devices/components. Additionally, or alternatively, the communications system(s) 116 may comprise systems/components operable to communicate wirelessly with external systems and/or devices through any suitable communication channel(s), such as, by way of non-limiting example, Bluetooth, ultra-wideband, WLAN, infrared communication, and/or others.

FIG. 1 illustrates that a system 100 may comprise or be in communication with sensor(s) 110. Sensor(s) 110 may comprise any device for capturing or measuring data representative of perceivable or detectable phenomenon. By way of non-limiting example, the sensor(s) 110 may comprise one or more image sensors, microphones, thermometers, barometers, magnetometers, accelerometers, gyroscopes, and/or others.

FIG. 1 also illustrates that the sensor(s) 110 may include image sensor(s) 112. As depicted in FIG. 1, image sensor(s) 112 may comprise an arrangement of image sensing pixels 120 that form a sensor array (e.g., a pixel array or focal plane array)/and are each configured to detect photons to facilitate image capture. For instance, where the image sensor(s) 112 comprise one or more SPAD sensors, the image sensing pixels 120 may facilitate avalanche events in response to sensing a photon, as described hereinabove. After detecting a photon, the image sensing pixels 120 may be recharged to prepare the image sensing pixels 120 for detecting additional avalanche events. Image sensor(s) 112 may be implemented on a system 100 (e.g., an MR HMD) to facilitate various functions such as, by way of non-limiting example, image capture and/or computer vision tasks.

Furthermore, FIG. 1 illustrates that a system 100 may comprise or be in communication with I/O system(s) 114. I/O system(s) 114 may include any type of input or output device such as, by way of non-limiting example, a touch screen, a mouse, a keyboard, a controller, and/or others, without limitation. For example, the I/O system(s) 114 may include a display system that may comprise any number of display panels, optics, laser scanning display assemblies, and/or other components.

FIG. 1 conceptually represents that the components of the system 100 may comprise or utilize various types of devices, such as mobile electronic device 100A (e.g., a smartphone), personal computing device 100B (e.g., a laptop), a mixed-reality head-mounted display 100C (HMD 100C), an aerial vehicle 100D (e.g., a drone), and/or other devices. Although the present description focuses, in at least some respects, on utilizing an HMD to implement embodiments of the present disclosure, additional or alternative types of systems may be used.

Figure 2:
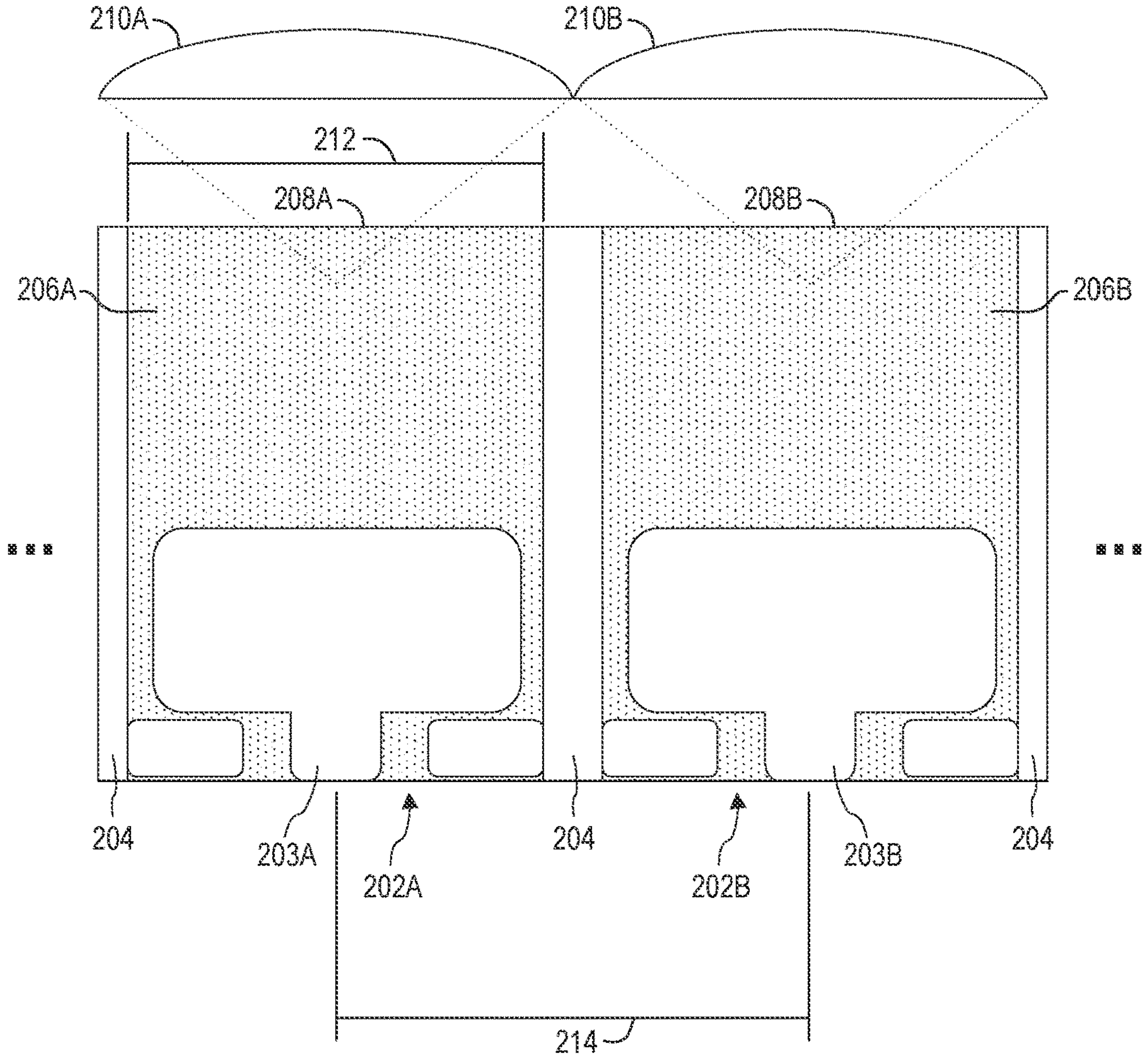
FIG. 2 illustrates an example of image sensing pixels of a low light image sensor.

As noted above, at least some embodiments of the present disclosure implement image sensing pixels with reduced silicon region volumes to enable acquisition of images with reduced dark current noise (e.g., particularly when imaging under low light conditions). FIG. 2 illustrates image sensing pixels 202A and 202B of an image sensor 200 for low light imaging. The image sensing pixels 202A and 202B each comprise semiconductor photodetectors 203A and 203B, respectively, which may comprise CMOS or SPAD components. The image sensing pixels 202A and 202B are separated by full deep trench isolation, as indicated in FIG. 2 by the illustrated isolation regions 204. The ellipses bounding the image sensing pixels 202A and 202B indicate that the image sensor 200 may comprise any number of image sensing pixels to form a sensor array.

FIG. 2 illustrates the silicon regions 206A and 206B and photon reception areas 208A and 208B of the image sensing pixels 202A and 202B, respectively. The silicon regions 206A and 206B can react to incident photons in various ways. For instance, the silicon regions 206A and 206B may comprise absorption regions (e.g., electron-hole pairs may be photogenerated) and/or multiplication regions (e.g., in the case of SPAD sensors, high electric field regions where avalanche multiplication may occur responsive to photogenerated electron-hole pairs). The silicon regions 206A and 206B are connected to the semiconductor photodetectors 203A and 203B, respectively, to facilitate quantification and/or measurement of environment light (as indicated by the reaction of the silicon regions 206A and 206B to incident photons).

The photon reception areas 208A and 208B are arranged on an environment-facing side of the image sensing pixels 202A and 202B. As noted above, the silicon regions 206A and 206B may comprise the optical input regions of the image sensing pixels 202A and 202B. For instance, micro-lenses 210A and 210B associated with the image sensing pixels 202A and 202B, respectively, may direct photons from the surrounding environment toward the photon reception areas 208A and 208B (which face the micro-lenses 210A and 210B) and into the silicon regions 206A and 206B (indicated in FIG. 2 by dotted lines extending from the micro-lenses 210A and 210B toward the silicon regions 206A and 206B). The photons that reach the silicon regions 206A and 206B may cause electron-hole pairs to be formed in the silicon regions 206A and 206B to facilitate image capture/formation (e.g., via photo-induced charge collection, photo-induced avalanche multiplication, etc.).

FIG. 2 illustrates the length or width 212 of the photon reception area 208A (or the silicon region 206A) of image sensing pixel 202A of the image sensor 200. FIG. 2 also shows a pixel pitch measurement 214, which comprises a center-to-center distance between the image sensing pixels 202A and 202B. As noted above, and as reflected in FIG. 2, the length or width 212 of the photon reception area 208A (or the silicon region 206A) of image sensing pixel 202A approaches the pixel pitch measurement 214 in an attempt to maximize the photon reception area 208A and/or the volume of the silicon region 206A to allow the image sensing pixel 202A to capture all available photons during image capture (particularly when imaging under low light conditions).

In contrast with the image sensor 200 shown in FIG. 2, at least some image sensors of the present disclosure comprise a reduced photon reception area and/or silicon region (e.g., relative to pixel pitch and/or other measurements), which contributes to mitigating dark current noise present in captured imagery.

Figure 3:
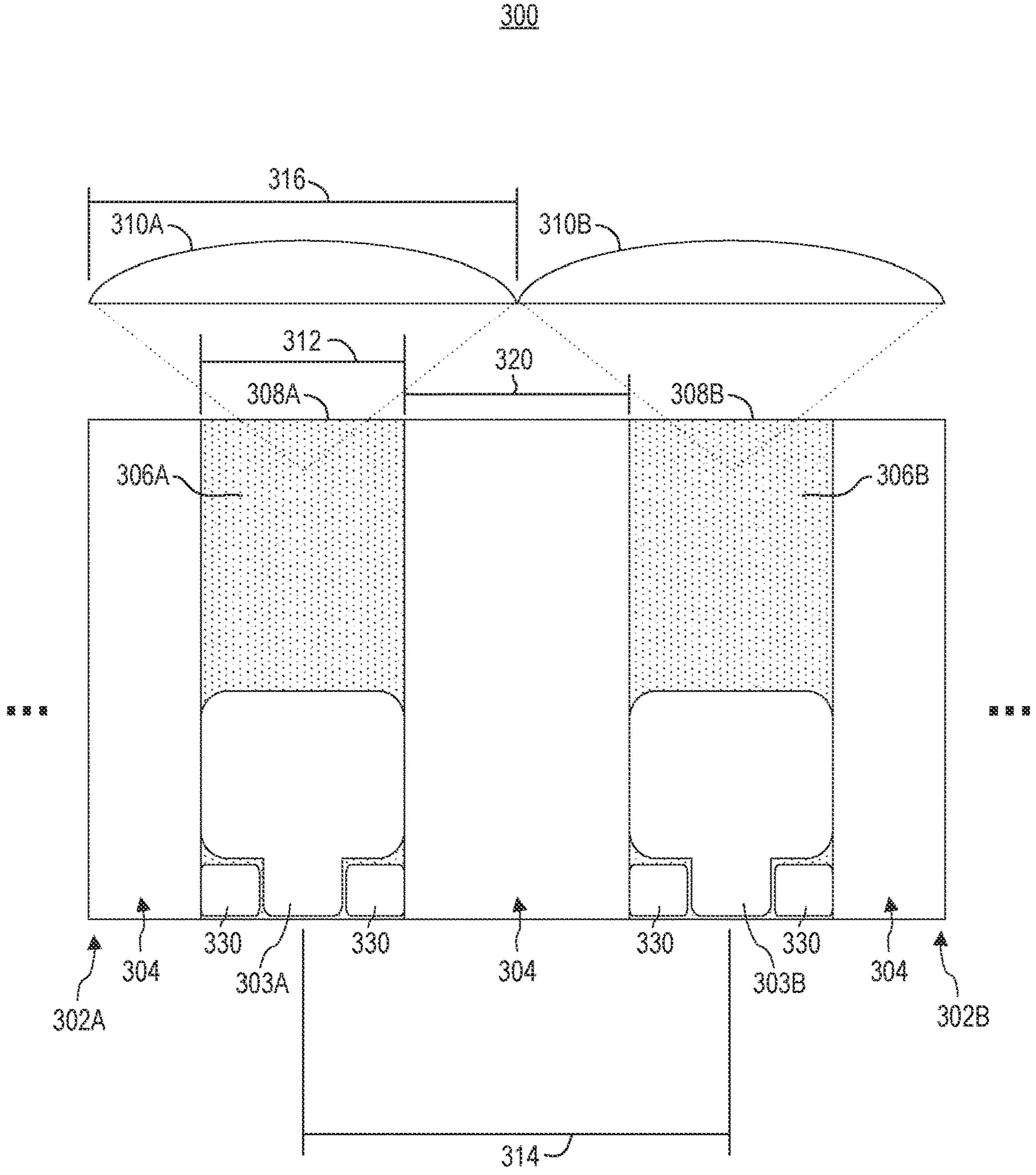
FIG. 3 illustrates an example of image sensing pixels of an image sensor that comprise reduced silicon region volumes, in accordance with implementations of the present disclosure.

FIG. 3 illustrates an example of image sensing pixels 302A and 302B of an image sensor 300 that is configured to capture imagery with mitigated dark current noise. The image sensing pixels 302A and 302B shown in FIG. 3 may be arranged along the same row or the same column of the image sensor 300. The image sensing pixels 302A and 302B of each comprise semiconductor photodetectors 303A and 303B, respectively, which may comprise CMOS or SPAD components (or other types of semiconductor photodetector componentry). In the example, of FIG. 3, the image sensing pixels 302A and 302B of the image sensor 300 are separated by full deep trench isolation, as indicated in FIG. 3 by the illustrated isolation regions 304. The ellipses bounding the image sensing pixels 302A and 302B indicate that the image sensor 300 may comprise any number of image sensing pixels to form a sensor array.

FIG. 3 furthermore illustrates that the image sensing pixels 302A and 302B of the image sensor 300 each comprise a respective silicon region 306A and 306B that includes a photon reception area 308A and 308B on an environment-facing portion of the silicon region 306A and/306B. As noted above, the silicon regions 306A and 306B may comprise optical input regions for the image sensing pixels 302A and 302B. Micro-lenses 310A and 310B associated with the image sensing pixels 302A and 302B, respectively, may direct photons from the surrounding environment through the photon reception areas 308A and 308B (which face the micro-lenses 310A and 310B) and into the silicon regions 306A and 306B, enabling the photons to cause electron-hole pairs to be formed in the silicon regions to facilitate image capture/image formation.

FIG. 3 illustrates the length or width 312 of the photon reception area 308A (or the silicon region 306A) of image sensing pixel 302A. FIG. 3 also illustrates a pixel pitch measurement 314 (e.g., center-to-center measurement) between the image sensing pixels 302A and 302B. In contrast with the length or width 212 of the photon reception area 208A (or the silicon region 206A) of the image sensing pixel 202A of the image sensor 200 shown in FIG. 2 (which is designed to approach the pixel pitch measurement 214 to maximize the photon reception area 208A and silicon region 206A volume for photon detection), the length or width 312 of the photon reception area 308A of image sensing pixel 302A is intentionally, and counter-intuitively, selected to be significantly less than the pixel pitch measurement 314, thereby reducing the photon reception area 308A and volume of the silicon region 306A. For instance, the length or width 312 of the photon reception area 308A may be smaller than about 80% of the pixel pitch measurement 314 (or smaller than about 75%, 70%, 65%, 60%, 55%, 50, 40%, or 30% of the pixel pitch measurement 314). Implementing image sensing pixel active areas that are smaller than about 80% of the pixel pitch measurement of an image sensor can allow the image sensor to be large enough to be suitable for low light imaging while still providing a sufficiently small silicon surface area and volume to effectuate a perceptible reduction in dark current noise present in imagery captured using the image sensor. As used herein, the term "about" is defined as including a range from 5% less than the indicated value to 5% larger than the indicated value.

By way of illustrative example, the pixel pitch measurement 314 of the image sensor 300 may comprise a length of about 10-11 μm. The length or width 312 of the photon reception area 308A and/or the silicon region 306A of the image sensing pixel 302A of the image sensor 300 may be less than about 60% of the pixel pitch measurement 314, such as about 6-6.6 μm or less.

As noted above, the reduced photon reception area 308A and/or silicon region 306A volume may advantageously contribute to reduced dark current noise in imagery captured by the image sensor 300 (e.g., by reducing the amount of surface area and/or volume in which surface defects may be present). Furthermore, in the case of SPAD image sensors, the reduced silicon region 306A may contribute to reduced SPAD junction capacitance, which can advantageously result in less power consumption per avalanche event.

Although the example of FIG. 3 only shows the length or the width 312 of the photon reception area 308A being less than about 80% of the pixel pitch measurement 314, embodiments where both the length and the width are less than about 80% of the pixel pitch measurement 314 are within the scope of the present disclosure. One will also appreciate, in view of the present disclosure, that any number of image sensing pixels of the image sensor 300 may comprise a photon reception area and/or silicon region with a length and/or width that is less than about 80% of the pixel pitch measurement. Furthermore, the shape of the photon reception areas shown in FIG. 3 are not limiting of the present disclosure, and other shapes may be used (e.g., circular photon reception areas, active photon reception areas of other polygonal shapes, etc.).

As noted above, the micro-lenses 310A and 310B may be configured to direct environment light toward the photon reception areas 308A and 308B and silicon regions 306A and 306B to allow photons from the environment to cause electron-hole pair generation in the silicon regions 306A and 306B. In some instances, the micro-lenses 310A and 310B are specifically manufactured or optimized to focus incident light from the environment toward the reduced-size photon reception areas 308A and 308B (relative to conventional photon reception areas of conventional low light image sensing pixels, which maximize size to maximize photon detection).

In some instances, the length or width 312 of the photon reception area 308A of image sensing pixel 302A, is selected to be less than the diameter 316 (or length or width) of the micro-lens 310A. For example, the length or width 312 of the photon reception area 308A may be less than about 80% of the diameter 316 of the micro-lens 310A. In some instances, the length or width 312 of the photon reception area 308A is less than about 75%, 70%, 65%, 60%, 55%, or 50% of the diameter 316 of the micro-lens 310A. Such a configuration can allow the micro-lenses to remain large enough to capture as many photons as possible (e.g., for low-light imaging) while still providing sufficiently small photon reception areas of the image sensing pixels to effectuate a mitigation in dark current noise present in imagery captured using the image sensor 300.

Figure 4:
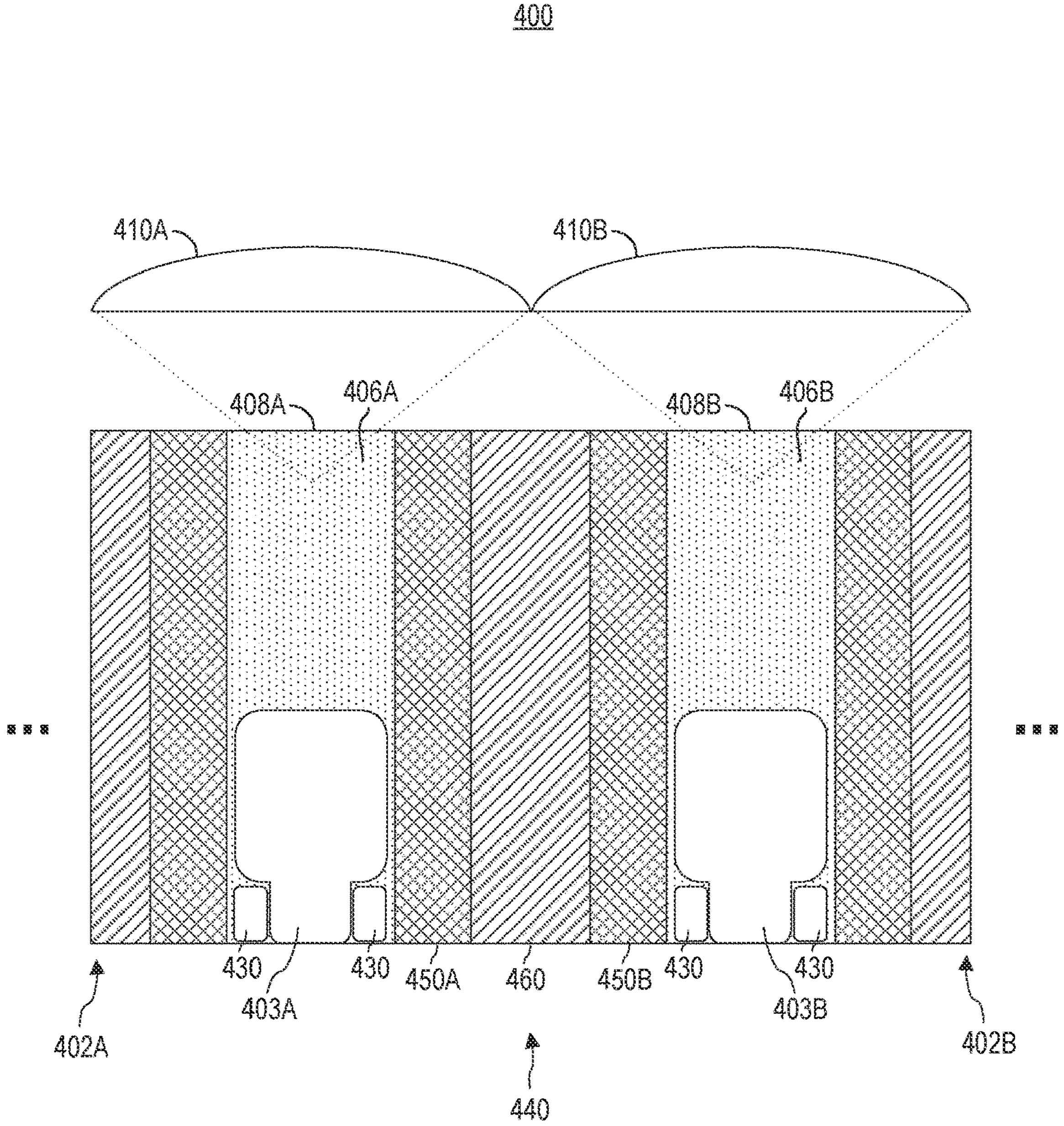
FIGS. 4 and 5 illustrate examples of image sensing pixels of image sensors with reduced silicon region volumes and that implement oxide and metal layers within isolation spaces, in accordance with implementations of the present disclosure.

FIG. 3 illustrates a distance 320 between the silicon region 306A of image sensing pixel 302A and the silicon region 306B of image sensing pixel 302B. The distance 320 may comprise a shortest distance between the silicon regions 306A and 306B, being orthogonal to sidewalls of the silicon regions 306A and 306B (and/or orthogonal to sidewalls of the isolation regions 304). As illustrated in FIG. 4, the distance 320 is appreciable relative to the pixel pitch measurement 314 (and/or the diameter 316 of the micro-lens 310A). For example, in some implementations, the distance 320 is greater than about 20% of the pixel pitch measurement 314 (or greater than about 25%, 30%, 35%, 40%, 45%, or 50% of the pixel pitch measurement 314). The distance 320 between the silicon regions 306A and 306B (or between photon reception areas 308A and 308B) contributes to the reduced size of the photon reception areas 308A and 308B and therefore contributes to reduced sensor noise (e.g., dark current noise).

Implementing distances between silicon regions that are greater than about 20% of the pixel pitch measurement of an image sensor allow the image sensor to be large enough to be suitable for low light imaging while still providing a sufficiently small silicon surface area and/or volume to effectuate a reduction in dark current noise present in imagery captured using the image sensor. Furthermore, implementing such distances between silicon regions can contribute to reduced optical crosstalk between sensor pixels.

The image sensing pixels 302A and 302B may comprise additional substrate(s) 330, which may comprise undoped (i-type) and/or doped substrates (e.g., p-type or n-type) and may take on various forms such as, by way of non-limiting example, charge layers, grading layers, buffer layers, depletion zones, potential wells, drains, and/or others. The image sensing pixels 302A and 302B may be in communication with various sensor electronics (not shown) such as readout, row/column selection, reset/quench, and/or other circuitries for facilitating image capture. For example, the additional substrate(s) 330 may comprise an N-well or a P-well, which may accommodate, respectively, an N-channel metal-oxide semiconductor (NMOS) transistor or a P-channel metal-oxide semiconductor (PMOS) transistor. The transistors may facilitate pixel operations by operating as, in the case of CMOS image sensors, a transfer gate, reset gate, a source follower, a row selection gate, etc., or, in the case of SPAD image sensors, a quenching transistor, a recharging transistor, a counter circuit, etc. In some instances, the NMOS or PMOS transistors are located on another wafer or substrate with electrical connection to the image sensing pixels 302A and/or 302B (e.g., via a pixel-level hybrid bonding process, such as Cu-to-Cu bonding).

As noted above, FIG. 3 illustrates the space between silicon regions 306A and 306B as being separated by isolation regions 304. The isolation regions 304 may be implemented as full deep trench isolation (DTI) regions and/or variations thereof. FIGS. 4-7 illustrate various example configurations for the isolation regions between adjacent silicon regions of image sensor pixels. Although the example configurations for the isolation regions and/or spaces between isolation regions are illustrated and/or described in relation to full deep trench isolation, the principles, configurations, and/or concepts illustrated and/or described may be applied to partial deep trench isolation.

FIG. 4 illustrates image sensing pixels 402A and 402B of an image sensor 400 that are generally similar to the image sensing pixels 302A and 302B of the image sensor 300. For instance, the image sensing pixels 402A and 402B of FIG. 4 include semiconductor photodetectors 403A and 403B (respectively), silicon regions 406A and 406B (respectively), photon reception areas 408A and 408B (respectively), micro-lenses 410A and 410B (respectively), and additional substrate(s) 430. FIG. 4 illustrates a space 440 between the adjacent image sensing pixels 402A and 402B of the image sensor 400 (e.g., between the silicon regions 406A and 406B). In the example of FIG. 4, the space 440 is occupied by metal and/or oxide layers. In particular, FIG. 4 illustrates the space 440 as comprising oxide layers 450A and 450B and a metal layer 460. The oxide layers 450A and 450B may comprise silicon dioxide (or possibly another isolation fill material, such as silicon nitride). The metal layer 460 may comprise tungsten, silver, or other metals (e.g., aluminum, copper, and/or others).

As shown in FIG. 4, the metal layer 460 and the oxide layers 450A and 450B are arranged at least partially transverse to the photon reception areas 408A and 408B of the silicon regions 406A and 406B of the image sensing pixels 402A and 402B (though other configurations may be used). In the example of FIG. 4, the oxide layers 450A and 450B are arranged adjacent to respective silicon regions (i.e., oxide layer 450A is arranged adjacent to silicon region 406A, and oxide layer 450B is arranged adjacent to silicon region 406B), and the metal layer 460 is arranged between the oxide layers 450A and 450B.

Although FIG. 4 illustrates a particular quantity of oxide layers and metal layers between adjacent silicon regions (i.e., two oxide layers and one metal layer), any quantity of oxide layers and metal layers may be utilized in accordance with the disclosed principles.

Figure 5:
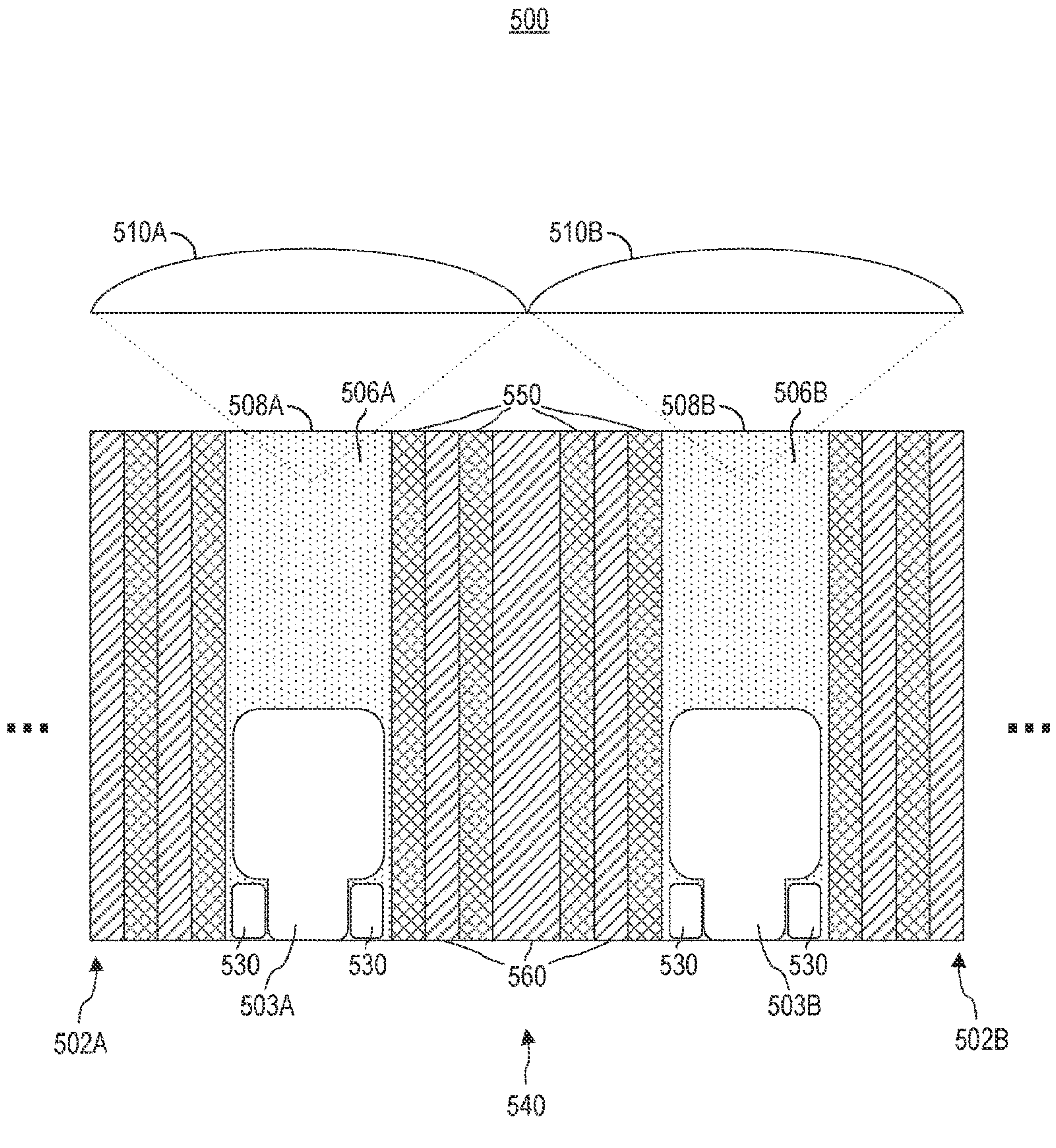

For instance, FIG. 5 illustrates image sensing pixels 502A and 502B of an image sensor 500 that are generally similar to the image sensing pixels 402A and 402B of the image sensor 400. For instance, the image sensing pixels 502A and 502B of FIG. 5 include semiconductor photodetectors 503A and 503B (respectively), silicon regions 506A and 506B (respectively), photon reception areas 508A and 508B (respectively), micro-lenses 510A and 510B (respectively), and additional substrate(s) 530. FIG. 5 illustrates the space 540 between the silicon regions 506A and 506B as including multiple oxide layers 550 and multiple metal layers 560. The quantity of metal layers and oxide layers that used to fill the isolation space between adjacent silicon regions may be selected based on manufacturing constraints and/or desired isolation characteristics (e.g., electrical isolation, structural support, etc.).

Figure 6:
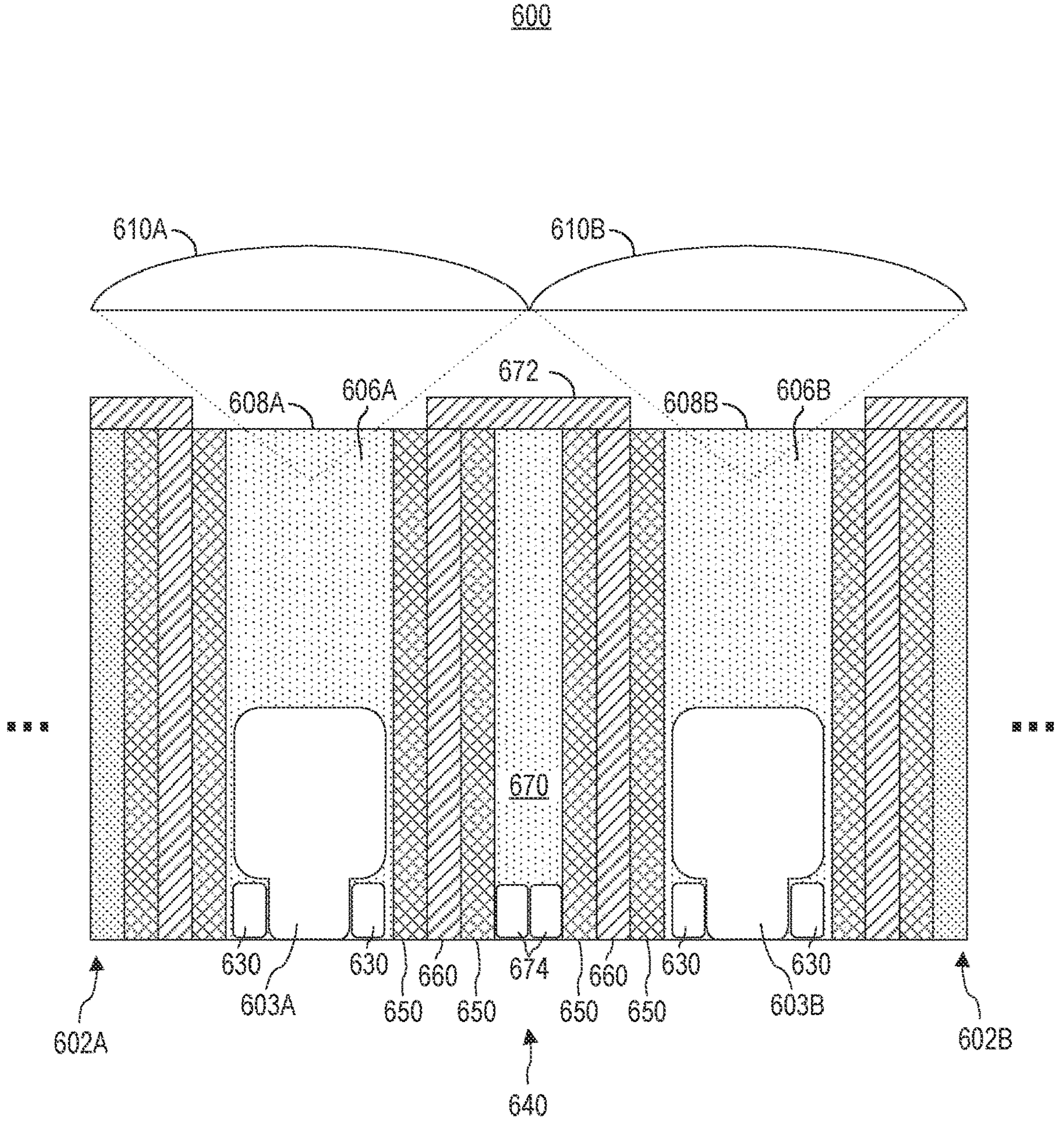
FIG. 6 illustrates an example of image sensing pixels of an image sensor with reduced silicon region volumes and that implement intermediate silicon regions within isolation spaces, in accordance with implementations of the present disclosure.

FIG. 6 illustrates image sensing pixels 602A and 602B of an image sensor 600 that are generally similar to the image sensing pixels 402A and 402B of the image sensor 400. For instance, the image sensing pixels 602A and 602B of FIG. 6 include semiconductor photodetectors 603A and 603B (respectively), silicon regions 606A and 606B (respectively), photon reception areas 608A and 608B (respectively), micro-lenses 610A and 610B (respectively), and additional substrate(s) 630.

In some implementations, the space 640 between the silicon regions 606A and 606B includes an intermediate silicon region 670, as illustrated in FIG. 6. The intermediate silicon region 670 may be utilized, in some instances, to accommodate manufacturing constraints. In the example of FIG. 6, the intermediate silicon region is arranged between oxide layers 650 and metal layers 660 that also reside within the space 640 between the silicon regions 606A and 606B.

To prevent photo-induced electron-hole pairs from being formed in the intermediate silicon region 670, the image sensor 600 of FIG. 6 includes a covering material 672 arranged over the environment-facing portion of the intermediate silicon region 670. The covering material 672 may comprise a metal, such as the same metal used in the metal layers 660 (though a different metal or other type of photo-opaque covering material may be used).

Though the covering material 672 may prevent (or at least mitigate) the incidence of photo-induced electron-hole pair formation, thermally induced electron-hole pair formation may still occur in the intermediate silicon region 670 (e.g., due to dark current). Thus, in some instances, the intermediate silicon region 670 is connected to an electron-hole pair drain 674, as illustrated in FIG. 6. The intermediate silicon region 670 that includes an electron-hole pair drain 674 may beneficially reduce optical crosstalk between the image sensing pixels 602A and 602B by absorbing photons crossing between the pixels.

Figure 7:
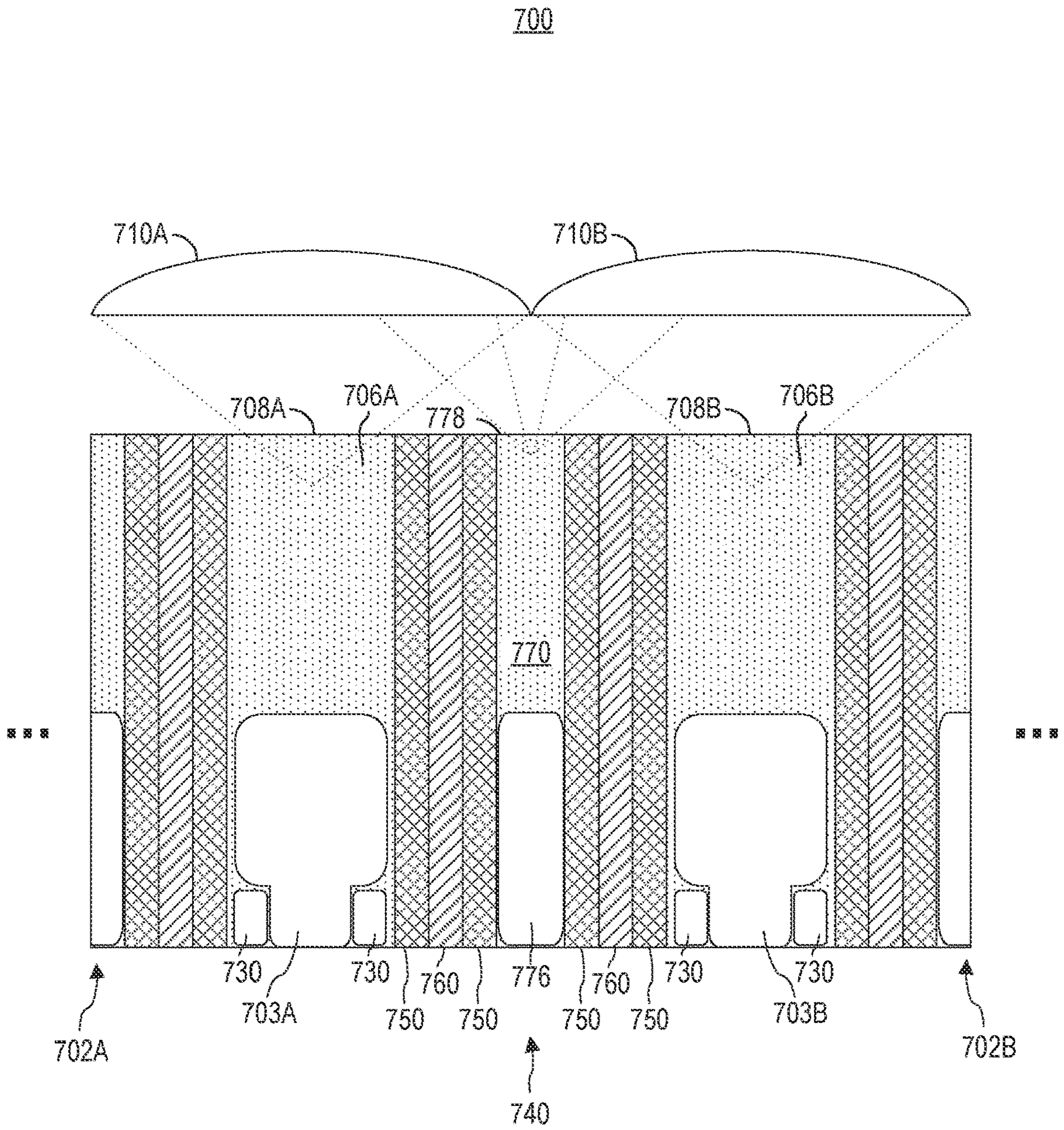
FIGS. 7 and 8 illustrate examples of image sensing pixels of image sensors with reduced silicon region volumes and that implement intermediate pixels within separation spaces, in accordance with implementations of the present disclosure.

In some implementations, the intermediate silicon region between two silicon regions of adjacent image sensing pixels of an image sensor is utilized as part of an intermediate pixel, which may contribute to image acquisition. FIG. 7 illustrates image sensing pixels 702A and 702B of an image sensor 700 that are generally similar to the image sensing pixels 602A and 602B of the image sensor 600. For instance, the image sensing pixels 702A and 702B of FIG. 7 include semiconductor photodetectors 703A and 703B (respectively), silicon regions 706A and 706B (respectively), photon reception areas 708A and 708B (respectively), micro-lenses 710A and 710B (respectively), and additional substrate(s) 730. FIG. 7 illustrates the space 740 between the silicon regions 706A and 706B as including an intermediate silicon region 770 between oxide layers 750 and metal layers 760.

In the example of FIG. 7, the intermediate silicon region 770 is connected to an intermediate semiconductor photodetector 776. The image sensor 700 of FIG. 7 also omits a covering material on the environment-facing surface of the intermediate silicon region 770 (in contrast to the image sensor 600 of FIG. 6), thereby allowing the environment-facing surface of the intermediate silicon region 770 to operate as an intermediate photon reception area 778. The intermediate silicon region 770 and the intermediate semiconductor photodetector 776 may thus operate as an intermediate pixel with a smaller size than the image sensing pixels 702A or 702B (e.g., with a smaller silicon region width relative to the pixel pitch between the image sensing pixels 702A and 702B). Although not shown in FIG. 7, the various other types of substrates may be connected to the intermediate silicon region 770 (e.g., similar to additional substrate(s) 730).

The intermediate pixel may contribute to image acquisition processes. For instance, FIG. 7 illustrates light leakage from the micro-lenses 710A and 710B reaching the intermediate silicon region 770 (indicated in FIG. 7 by the dotted lines extending from the micro-lenses 710A and 710B toward the intermediate silicon region 770). The light leakage from the micro-lenses 710A and 710B that reaches the silicon region 770 may cause one or more electron-hole pairs to be formed in the intermediate silicon region 770, which may be measured or quantified (or which may cause events/effects that may be measured or quantified). Such measurements or quantifications may be used to determine a signal, which may be used to determine image pixel values for image formation.

The signal detected by the intermediate pixel may contribute to image formation in various ways. For instance, the intermediate pixel signal may be aggregated with the pixel signal of one or more adjacent image sensing pixels (e.g., image sensing pixels 702A and/or 702B) to determine image pixel values. Such aggregation may contribute to increased dynamic range of the image sensor 700 (e.g., by effectively increasing the full-well capacity of the image sensing pixels 702A and 702B). Aggregation of the intermediate pixel signal with adjacent image sensing pixel signals may be accomplished in various ways, such as by sampling, blending, adding, combining, or otherwise compositing a combination of one or more image sensing pixel signals and one or more adjacent intermediate pixel signals to obtain image pixel values. In some instances, the intermediate pixel signal is only utilized in image pixel value determination when the intermediate pixel signal satisfies one or more conditions (e.g., satisfies a threshold signal level, which may be determined by using a comparator).

Figure 8:
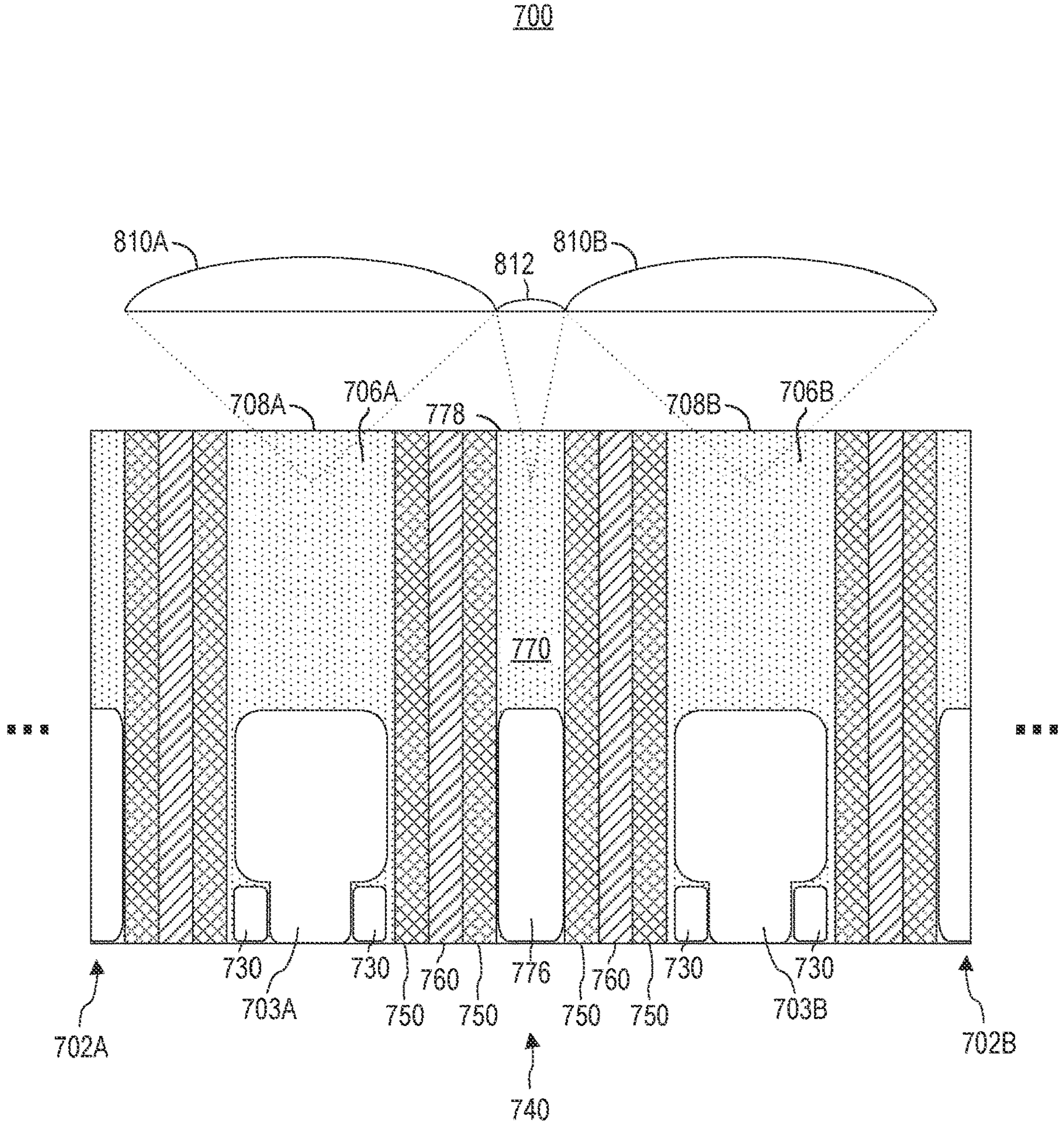

Although FIG. 7 illustrates the intermediate silicon region 770 as receiving leakage light via the micro-lenses 710A and 710B, other configurations are within the scope of the present disclosure. For instance, FIG. 8 illustrates the image sensor 700 with a different micro-lens configuration. In particular, micro-lenses 810A and 810B are associated with image sensing pixels 702A and 702B, respectively, while intermediate micro-lens 812 is associated with the intermediate pixel (e.g., formed from the intermediate silicon region 770 and the intermediate semiconductor photodetector 776). The intermediate micro-lens 812 of FIG. 8 is arranged between the micro-lenses 810A and 810B and comprises a smaller size/diameter than the micro-lenses 810A and 810B. The intermediate micro-lens 812 may direct environment light toward the intermediate silicon region 770, whereas the micro-lenses 810A and 810B may direct light toward the silicon regions 706A and 706B, respectively (as indicated in FIG. 8 by the dotted lines extending from the various micro-lenses toward the various silicon region).

Although various image sensing pixel examples discussed herein include a silicon region for receiving photons to enable generation of electron-hole pairs to facilitate image capture, it will be appreciated that other types of photosensitive regions (e.g., non-silicon regions/materials) may be utilized in accordance with the disclosed principles (e.g., gallium arsenide, indium phosphide, cadmium telluride, and/or other photosensitive regions/materials).

Additional Details Related to Implementing the Disclosed Embodiments

Disclosed embodiments may comprise or utilize a special purpose or general-purpose computer including computer hardware, as discussed in greater detail below. Disclosed embodiments also include physical and other computer-readable media for carrying or storing computer-executable instructions and/or data structures. Such computer-readable media can be any available media that can be accessed by a general-purpose or special-purpose computer system. Computer-readable media that store computer-executable instructions in the form of data are one or more "physical computer storage media" or "hardware storage device(s)." Computer-readable media that merely carry computer-executable instructions without storing the computer-executable instructions are "transmission media." Thus, by way of example and not limitation, the current embodiments can comprise at least two distinctly different kinds of computer-readable media: computer storage media and transmission media.

Computer storage media (aka "hardware storage device") are computer-readable hardware storage devices, such as RAM, ROM, EEPROM, CD-ROM, solid state drives ("SSD") that are based on RAM, Flash memory, phase-change memory ("PCM"), or other types of memory, or other optical disk storage, magnetic disk storage or other magnetic storage devices, or any other medium that can be used to store desired program code means in hardware in the form of computer-executable instructions, data, or data structures and that can be accessed by a general-purpose or special-purpose computer.

A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmission media can include a network and/or data links which can be used to carry program code in the form of computer-executable instructions or data structures and which can be accessed by a general purpose or special purpose computer. Combinations of the above are also included within the scope of computer-readable media.

Further, upon reaching various computer system components, program code means in the form of computer-executable instructions or data structures can be transferred automatically from transmission computer-readable media to physical computer-readable storage media (or vice versa). For example, computer-executable instructions or data structures received over a network or data link can be buffered in RAM within a network interface module (e.g., a "NIC"), and then eventually transferred to computer system RAM and/or to less volatile computer-readable physical storage media at a computer system. Thus, computer-readable physical storage media can be included in computer system components that also (or even primarily) utilize transmission media.

Computer-executable instructions comprise, for example, instructions and data which cause a general-purpose computer, special purpose computer, or special purpose processing device to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Disclosed embodiments may comprise or utilize cloud computing. A cloud model can be composed of various characteristics (e.g., on-demand self-service, broad network access, resource pooling, rapid elasticity, measured service, etc.), service models (e.g., Software as a Service ("SaaS"), Platform as a Service ("PaaS"), Infrastructure as a Service ("IaaS"), and deployment models (e.g., private cloud, community cloud, public cloud, hybrid cloud, etc.).

Those skilled in the art will appreciate that the invention may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAS, pagers, routers, switches, wearable devices, and the like. The invention may also be practiced in distributed system environments where multiple computer systems (e.g., local and remote systems), which are linked through a network (either by hardwired data links, wireless data links, or by a combination of hardwired and wireless data links), perform tasks. In a distributed system environment, program modules may be located in local and/or remote memory storage devices.

Alternatively, or in addition, the functionality described herein can be performed, at least in part, by one or more hardware logic components. For example, and without limitation, illustrative types of hardware logic components that can be used include Field-programmable Gate Arrays (FPGAs), Program-specific Integrated Circuits (ASICs), Application-specific Standard Products (ASSPs), System-on-a-chip systems (SOCs), Complex Programmable Logic Devices (CPLDs), central processing units (CPUs), graphics processing units (GPUs), and/or others.

As used herein, the terms "executable module," "executable component," "component," "module," or "engine" can refer to hardware processing units or to software objects, routines, or methods that may be executed on one or more computer systems. The different components, modules, engines, and services described herein may be implemented as objects or processors that execute on one or more computer systems (e.g., as separate threads).

One will also appreciate how any feature or operation disclosed herein may be combined with any one or combination of the other features and operations disclosed herein. Additionally, the content or feature in any one of the figures may be combined or used in connection with any content or feature used in any of the other figures. In this regard, the content disclosed in any one figure is not mutually exclusive and instead may be combinable with the content from any of the other figures.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope

We claim:

1. An image sensor configured to capture imagery with mitigated noise, the image sensor comprising:

a plurality of image sensing pixels arranged to form a sensor array, wherein:

each image sensing pixel of the plurality of image sensing pixels comprises a semiconductor photodetector connected to a photosensitive region that comprises a photon reception area configured to receive photons to facilitate image capture, each photon reception area comprises a length and a width, for at least a particular image sensing pixel of the plurality of image sensing pixels, the length or the width of the photon reception area is smaller than about 80% of a pixel pitch measurement between the particular image sensing pixel and an adjacent image sensing pixel of the plurality of image sensing pixels, wherein the length or the width of the photon reception area contributes to reduced volume of the photosensitive region to mitigate sensor noise for the image sensor, and a space between the photosensitive region of the particular image sensing pixel and the photosensitive region of the adjacent image sensing pixel comprises a plurality of oxide layers arranged transverse to the photon reception area, wherein the plurality of oxide layers comprises a first oxide layer arranged adjacent to the photosensitive region of the particular image sensing pixel and a second oxide layer arranged adjacent to the photosensitive region of the adjacent image sensing pixel.

2. The image sensor of claim 1, wherein the image sensor comprises a single photon avalanche diode (SPAD) image sensor.

3. The image sensor of claim 1, wherein the image sensor comprises a complementary metal-oxide-semiconductor (CMOS) image sensor.

4. The image sensor of claim 1, wherein at least one metal layer is arranged between the first oxide layer and the second oxide layer.

5. The image sensor of claim 1, wherein one or more additional oxide layers are arranged between the first oxide layer and the second oxide layer.

6. The image sensor of claim 1, wherein the space between the photosensitive region of the particular image sensing pixel and the photosensitive region of the adjacent image sensing pixel comprises an intermediate silicon region.

7. The image sensor of claim 6, wherein the intermediate silicon region is arranged between at least one oxide layer of the plurality of oxide layers and at least one metal layer.

8. The image sensor of claim 6, wherein the intermediate silicon region is connected to an electron-hole pair drain.

9. The image sensor of claim 6, further comprising a covering material arranged over an environment-facing portion of the intermediate silicon region.

10. The image sensor of claim 6, wherein the intermediate silicon region is connected to an intermediate semiconductor photodetector to form an intermediate pixel, wherein the intermediate pixel comprises a smaller size than the particular image sensing pixel.

11. The image sensor of claim 10, wherein the intermediate silicon region is arranged to receive light leakage from micro-lenses associated with the particular image sensing pixel and the adjacent image sensing pixel.

12. The image sensor of claim 11, wherein the intermediate silicon region is arranged to receive light from an intermediate micro-lens arranged between micro-lenses associated with the particular image sensing pixel and the adjacent image sensing pixel.

13. An image sensor configured to capture imagery with mitigated noise, the image sensor comprising:

a plurality of image sensing pixels arranged to form a sensor array, wherein:

each image sensing pixel of the plurality of image sensing pixels comprises a semiconductor photodetector connected to a photosensitive region that comprises a photon reception area configured to receive photons to facilitate image capture, each photon reception area comprises a length and a width, for at least a particular image sensing pixel of the plurality of image sensing pixels, the length or the width of the photon reception area is smaller than about 80% of a pixel pitch measurement between the particular image sensing pixel and an adjacent image sensing pixel of the plurality of image sensing pixels, wherein the length or the width of the photon reception area contributes to reduced volume of the photosensitive region to mitigate sensor noise for the image sensor, and a space between the photosensitive region of the particular image sensing pixel and the photosensitive region of the adjacent image sensing pixel comprises an intermediate silicon region and does not include a semiconductor photodetector.

14. The image sensor of claim 13, wherein one or more oxide layers or one or more metal layers intervene between the photosensitive region of the particular image sensing pixel and the intermediate silicon region.

15. The image sensor of claim 13, wherein the intermediate silicon region is connected to an electron-hole pair drain.

16. The image sensor of claim 15, further comprising a covering material arranged over an environment-facing portion of the intermediate silicon region.

17. An image sensor configured to capture imagery with mitigated noise, the image sensor comprising:

a plurality of image sensing pixels arranged to form a sensor array, wherein:

each image sensing pixel of the plurality of image sensing pixels comprises a semiconductor photodetector connected to a photosensitive region that comprises a photon reception area configured to receive photons to facilitate image capture, each photon reception area comprises a length and a width, for at least a particular image sensing pixel of the plurality of image sensing pixels, the length or the width of the photon reception area is smaller than about 80% of a pixel pitch measurement between the particular image sensing pixel and an adjacent image sensing pixel of the plurality of image sensing pixels, wherein the length or the width of the photon reception area contributes to reduced volume of the photosensitive region to mitigate sensor noise for the image sensor, and a space between the photosensitive region of the particular image sensing pixel and the photosensitive region of the adjacent image sensing pixel comprises an intermediate silicon region that is connected to an intermediate semiconductor photodetector, wherein the intermediate semiconductor photodetector comprises a smaller size than the semiconductor photodetector of the particular image sensing pixel.

18. The image sensor of claim 17, wherein:

the intermediate silicon region is arranged to receive light leakage from micro-lenses associated with the particular image sensing pixel and the adjacent image sensing pixel, or the intermediate silicon region is arranged to receive light from an intermediate micro-lens arranged between micro-lenses associated with the particular image sensing pixel and the adjacent image sensing pixel.

* * * * *